US012580403B2

(12) United States Patent
Shim et al.

(10) Patent No.: US 12,580,403 B2
(45) Date of Patent: Mar. 17, 2026

(54) METHOD AND APPARATUS FOR ESTIMATING CHARGING TIME OF BATTERY

(71) Applicant: Samsung SDI Co., Ltd., Yongin-si (KR)

(72) Inventors: Youngwoo Shim, Yongin-si (KR); Youngshin Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 910 days.

(21) Appl. No.: 17/869,635

(22) Filed: Jul. 20, 2022

(65) Prior Publication Data

US 2023/0045708 A1     Feb. 9, 2023

(30) Foreign Application Priority Data

Aug. 5, 2021     (KR) ......................... 10-2021-0103439

(51) Int. Cl.
*H02J 7/00*      (2006.01)
*G01R 31/36*      (2020.01)
*G01R 31/389*      (2019.01)

(52) U.S. Cl.
CPC ........ *H02J 7/0049* (2020.01); *G01R 31/3648* (2013.01); *G01R 31/389* (2019.01); *H02J 7/00041* (2020.01)

(58) Field of Classification Search
USPC ....................................................... 320/132
See application file for complete search history.

(56) References Cited

U.S. PATENT DOCUMENTS

| | | |
|---|---|---|
| 10,656,211 B2 | 5/2020 | Ha et al. |
| 11,437,829 B2 | 9/2022 | Shin et al. |
| (Continued) | | |

FOREIGN PATENT DOCUMENTS

| | | |
|---|---|---|
| JP | 2020-36393 A | 3/2020 |
| JP | 6791386 B2 | 11/2020 |
| (Continued) | | |

OTHER PUBLICATIONS

Korean Notice of Allowance dated Dec. 21, 2023, issued in corresponding Korean Patent Application No. 10-2021-0103439, 2 pages.

(Continued)

*Primary Examiner* — Samuel Berhanu
(74) *Attorney, Agent, or Firm* — Womble Bond Dickinson (US) LLP

(57)     ABSTRACT

A method of estimating a charging time of a battery, includes: estimating an SOC of the battery by measuring at least one parameter of the battery; estimating an internal resistance of the battery based on the at least one parameter of the battery, the SOC of the battery, and SOC-OCV data; estimating a time length of a constant current (CC) charging section based on the SOC, the internal resistance, and the at least one parameter of the battery; and estimating a time length of a constant voltage (CV) charging section based on the SOC, the internal resistance, and the at least one parameter of the battery. The estimating of the time length of the CV charging section includes: estimating a charging current of the battery in a unit of an SOC step; and calculating the time length of the CV charging section in the unit of the SOC step.

13 Claims, 6 Drawing Sheets

(56)                    References Cited

U.S. PATENT DOCUMENTS

| | | | | |
|---|---|---|---|---|
| 11,658,503 | B2 | 5/2023 | Arizono | |
| 2021/0218257 | A1* | 7/2021 | Wu | H01M 10/44 |
| 2021/0370796 | A1 | 12/2021 | Seo | |
| 2021/0399567 | A1* | 12/2021 | Yamaguchi | H02J 7/0049 |

FOREIGN PATENT DOCUMENTS

| | | |
|---|---|---|
| KR | 10-2017-0010968 A | 2/2017 |
| KR | 10-2018-0114206 | 10/2018 |
| KR | 10-2019-0083897 A | 7/2019 |
| KR | 10-2020-0062688 | 6/2020 |
| KR | 10-2021-0029878 | 3/2021 |
| WO | WO 2019/026143 A1 | 2/2019 |

OTHER PUBLICATIONS

European Search Report for EP Application No. 22183024.3 dated Jan. 9, 2023, 7 pages.
Shi, J., et al. "Electric Vehicle Battery Remaining Charging Time Estimation Considering Charging Accuracy and Charging Profile Prediction," arxiv.org, Dec. 9, 2020, XP081833552, 15 pages.
Shin, D., et al. "A Compact Macromodel for the Charge Phase of a Battery with Typical Charging Protocol," Low Power Electronics and Design, ACM, Aug. 11, 2014, pp. 267-270.

* cited by examiner

START

ESTIMATE SOC OF BATTERY — S100

ESTIMATE INTERNAL RESISTANCE OF BATTERY — S200

ESTIMATE TIME OF CONSTANT CURRENT CHARGING SECTION — S300

ESTIMATE TIME OF CONSTANT VOLTAGE CHARGING SECTION — S400

END

START

ESTIMATE CHARGING CURRENT IN UNIT OF SOC STEP — S410

CALCULATE CHARGING TIME IN UNIT OF SOC STEP — S420

END

METHOD AND APPARATUS FOR ESTIMATING CHARGING TIME OF BATTERY

CROSS-REFERENCE TO RELATED APPLICATION

This application claims priority to and the benefit of Korean Patent Application No. 10-2021-0103439, filed on Aug. 5, 2021, in the Korean Intellectual Property Office, the entire disclosure of which is incorporated by reference herein.

BACKGROUND

1. Field

Aspects of embodiments of the present disclosure relate to a method and apparatus for estimating a charging time of a battery, and more particularly, to a method, a computer program, and an apparatus for estimating a charging time of a battery, which may effectively estimate a charging time of a secondary battery in a process of estimating the charging time of the secondary battery.

2. Description of the Related Art

Recently, as the demand for portable electronic products, such as laptops, video cameras, and mobile phones, is rapidly increasing, and energy storage batteries, robots, satellites, or the like are being developed in earnest, research of high performance secondary batteries capable of repeated charging/discharging has been actively conducted.

Currently commercialized secondary batteries include nickel cadmium batteries, nickel hydrogen batteries, nickel zinc batteries, lithium secondary batteries, and the like. From among the batteries, the lithium secondary batteries may have reduced memory effects when compared with nickel-based secondary batteries, and thus, are freely charged/discharged while exhibiting a very low self-discharge rate and high energy density.

Recently, with the steady exhaustion of carbon energy and increasing interest in the environment, the demand for hybrid vehicles and electric vehicles has gradually increased all over the world, including the United States, Europe, Japan, and the Republic of Korea. Hybrid vehicles and electric vehicles are supplied with power for driving the vehicles from the charging/discharging energy of battery packs, and thus, in comparison with vehicles that are powered by an engine alone, the hybrid vehicles and electric vehicles have higher fuel efficiency. Accordingly, hybrid vehicles and electric vehicles may eliminate or lessen the emission of pollutants, and thus, are receiving positive responses from many consumers. Therefore, more attention and research are being focused on vehicle batteries that are used in hybrid vehicles, electric vehicles, and the like.

The secondary battery may be utilized in various mobile devices, such as vehicles. Because the battery may have limited usage time, accurate information about a state-of-charge (SOC) of the battery may be desired. Also, when the battery is charged, it may be desired to predict a charging time. The charging time is a measure to determine whether to continue the charging of the battery in order to be fully charged, and thus, may be important information for a user to know in order to use the device.

The above information disclosed in this Background section is for enhancement of understanding of the background of the present disclosure, and therefore, it may contain information that does not constitute prior art.

SUMMARY

In general, when estimating the charging time of secondary batteries, the charging time may be calculated by dividing the capacity of a secondary battery by a charging injection current. In this case, a value of a charging current that the secondary battery may accept may change during charging, and thus, it may be difficult to accurately estimate the charging time.

In addition, due to a difference in a temperature and/or a deterioration rate of the secondary battery, there may be a difference between the charging time that is displayed to a driver (e.g., a user or driver of the vehicle) while charging is in progress and the actual charging time. The difference between the charging times may confuse the driver. In addition, due to the difference between the actual charging time and the estimated charging time, the driver may lose confidence in the charging time that is displayed on the vehicle.

Embodiments of the present disclosure are directed to a method, a computer program, and an apparatus for estimating a charging time of a battery, which may effectively estimate the charging time of the battery in a process of estimating the charging time of the battery, and thus, the difference between the actual charging time of the battery and the estimated charging time of the battery may be minimized or reduced.

However, the present disclosure is not limited to the above aspects and features, and additional aspects and features will be set forth, in part, in the description that follows, and in part, will be apparent from the description, or may be learned by practicing one or more of the presented embodiments of the present disclosure.

According to one or more embodiments of the present disclosure, a method of estimating a charging time of a battery, includes: estimating a state-of-charge (SOC) of the battery by measuring at least one parameter of the battery; estimating an internal resistance of the battery based on the at least one parameter of the battery, the SOC of the battery, and SOC-open circuit voltage (OCV) data; estimating a time length of a constant current charging section based on the SOC, the internal resistance, and the at least one parameter of the battery; and estimating a time length of a constant voltage charging section based on the SOC, the internal resistance, and the at least one parameter of the battery. The estimating of the time length of the constant voltage charging section includes: estimating a charging current of the battery in a unit of an SOC step based on the SOC, the internal resistance, and the at least one parameter of the battery; and calculating the time length of the constant voltage charging section in the unit of the SOC step based on the SOC, the at least one parameter, and the charging current of the battery.

In an embodiment, the at least one parameter may include a voltage, a current, and a temperature of the battery.

In an embodiment, the estimating of the internal resistance of the battery may include: calculating a first internal resistance of the battery with respect to the SOC of the battery based on SOC-internal resistance data of the battery; estimating a second internal resistance of the battery by calculating an OCV of the battery by using the SOC-OCV data, based on the SOC of the battery, and a difference between the OCV and a voltage of the battery; and calculating a third internal resistance of the battery with respect to a plurality of SOC grid points based on the first internal resistance and the second internal resistance.

In an embodiment, the estimating of the second internal resistance may include: calculating the OCV of the battery by using the SOC-OCV data, based on the SOC of the battery; estimating an estimated internal resistance of the battery based on a difference between the OCV and the voltage of the battery; deriving a linear regression equation based on the estimated internal resistance as a Y value and the SOC as an X value with respect to the estimated internal resistance and the SOC of the battery; and calculating the second internal resistance of the battery with respect to the plurality of SOC grid points, based on the linear regression equation.

In an embodiment, the plurality of SOC grid points may indicate, based on the SOC of the battery on a horizontal axis and the internal resistance of the battery on a vertical axis, points for estimating the internal resistance of the battery with respect to an SOC of the horizontal axis.

In an embodiment, the calculating of the third internal resistance may include: calculating an internal resistance update value by multiplying a difference between the first internal resistance and the second internal resistance by a coefficient; and calculating the third internal resistance by adding the first internal resistance and the internal resistance update value.

In an embodiment, the SOC step may represent a reference value dividing the constant current charging section and the constant voltage charging section, by an SOC unit, between a start SOC of the battery at a time point at which charging of the battery starts and an end SOC at a time point at which the charging is completed.

In an embodiment, non-transitory computer readable media containing program instructions that, when executed by a computing device, may cause the computing device to perform the method of claim 1.

According to one or more embodiments of the present disclosure, an apparatus for estimating a charging time of a battery, includes: memory storing data generated by measuring at least one parameter of the battery being charged; and at least one processor configured to: estimate a state-of-charge (SOC) of the battery based on at least one parameter of the battery; estimate an internal resistance of the battery based on the at least one parameter of the battery, the SOC of the battery, and SOC-open circuit voltage (OCV) data; estimate a time length of a constant current charging section based on the SOC, the internal resistance, and the at least one parameter of the battery; estimate a time length of a constant voltage charging section based on the SOC, the internal resistance, and the at least one parameter of the battery; estimate a charging current of the battery in a unit of an SOC step based on the SOC, the internal resistance, and the at least one parameter of the battery; and calculate the time length of the constant voltage charging section in the unit of the SOC step based on the SOC, the at least one parameter, and the charging current of the battery.

In an embodiment, the at least one parameter may include a voltage, a current, and a temperature of the battery.

In an embodiment, the internal resistance of the battery may include a first internal resistance, an estimated internal resistance, a second internal resistance, and a third internal resistance; the first internal resistance may be calculated with respect to the SOC of the battery based on SOC-internal resistance data of the battery; the estimated internal resistance may be estimated by calculating an OCV of the battery based on the SOC-OCV data, the SOC of the battery, and a difference between the OCV and a voltage of the battery; the second internal resistance may be estimated with respect to a plurality of SOC grid points, based on a linear regression equation, the estimated internal resistance, and the SOC; and the third internal resistance may be calculated with respect to the plurality of SOC grid points based on the first internal resistance and the second internal resistance.

In an embodiment, the linear regression equation may be derived based on the estimated internal resistance as a Y value and the SOC as an X value.

In an embodiment, the plurality of SOC grid points may indicate, based on the SOC of the battery on a horizontal axis and the internal resistance of the battery on a vertical axis, points for estimating the internal resistance of the battery with respect to an SOC of the horizontal axis.

In an embodiment, the third internal resistance may be calculated by adding the first internal resistance and an internal resistance update value, and the internal resistance update value may be calculated by multiplying a difference between the first internal resistance and the second internal resistance by a coefficient.

In an embodiment, the SOC step may represent a reference value dividing the constant current charging section and the constant voltage charging section, by an SOC unit, between a start SOC of the battery at a time point at which charging of the battery starts and an end SOC at a time point at which the charging is completed.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
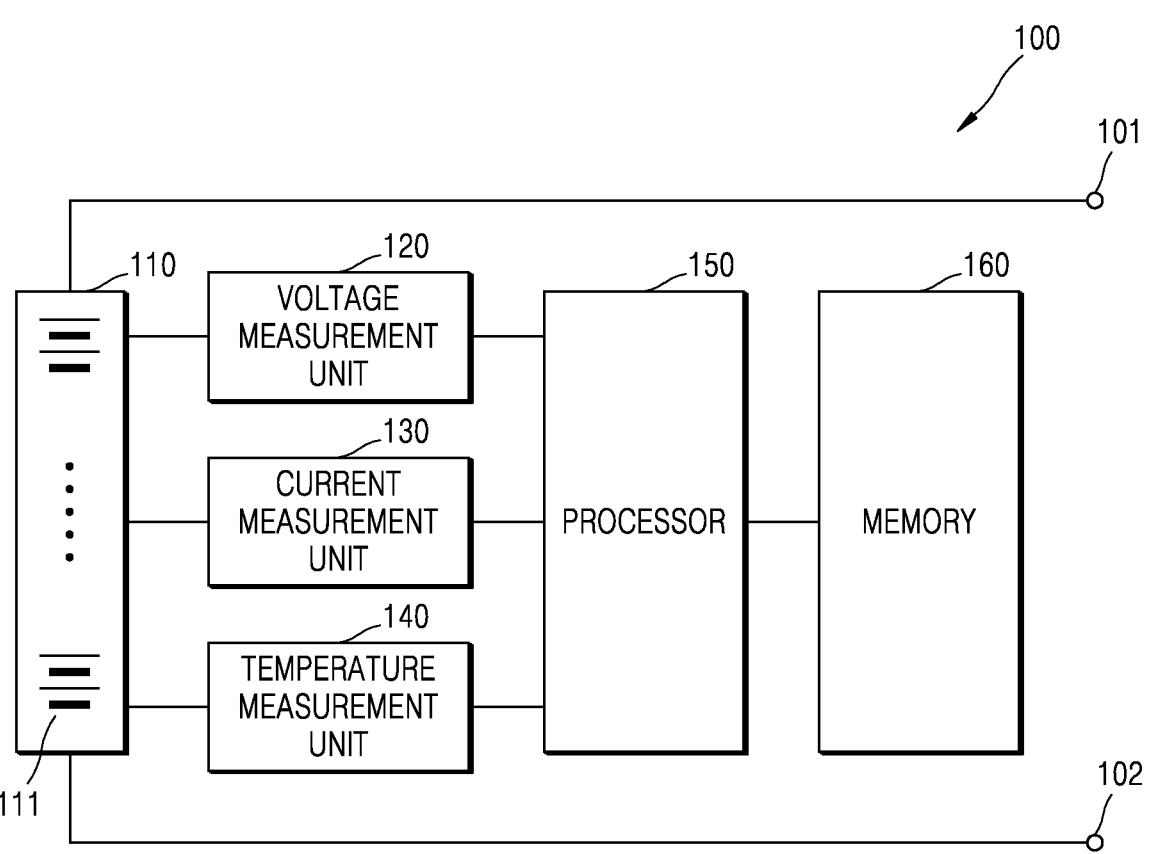
FIG. 1 is a block diagram schematically showing a battery pack according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

Hereinafter, some embodiments may be shown and/or described in terms of functional block components and various processing steps. Some or all of such functional blocks may be realized by any number of hardware and/or software components configured to perform the specified functions. For example, the functional blocks may be implemented by one or more microprocessors or by circuit components for performing a predetermined function. The functional blocks may be implemented with any suitable programming or scripting language. The functional blocks may be implemented in algorithms that are executed on one or more processors. A function performed by a functional block may be performed by a plurality of functional blocks, or functions performed by a plurality of functional blocks may be performed by one functional block. Furthermore, the various embodiments of the present disclosure may employ any number of conventional techniques for electronics configuration, signal processing and/or control, data processing, and the like.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
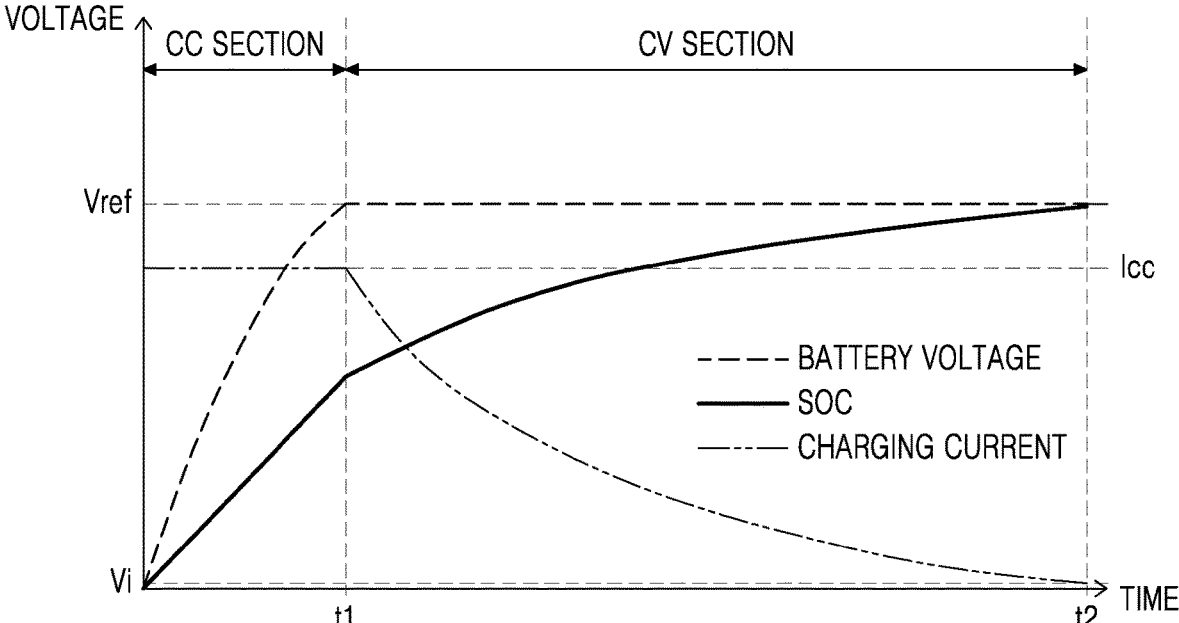
FIG. 2 is a diagram illustrating an example operation of a processor according to an embodiment of the present disclosure.

FIG. 1 is a block diagram schematically showing a battery pack according to an embodiment of the present disclosure. FIG. 2 is a diagram illustrating an example operation of a processor according to an embodiment of the present disclosure.

First, referring to FIG. 1, a battery pack 100 includes a battery 110, a processor 150, a memory 160, a voltage measurement unit (e.g., a voltage measurer or a voltage measurement circuit) 120, a current measurement unit (e.g., a current measurer or a current measurement circuit) 130, and a temperature measurement unit (e.g., a temperature measurer or a temperature measurement circuit) 140.

The battery 110 may include at least one battery cell 111, and the battery cell 111 may be a chargeable secondary battery. For example, the battery cell 111 may include at least one selected from the group consisting of a nickel-cadmium battery, a lead storage battery, a nickel metal hydride (NiMH) battery, a lithium ion battery, a lithium polymer battery, and the like.

The number and connection method of battery cells 111 included in the battery 110 may be determined based on a desired amount of electric power and voltage, which are required for the battery pack 100. Although FIG. 1 shows for conceptual purposes only that the battery cells 111 included in the battery 110 are connected with each other in series, the battery cells 111 may be connected with each other in parallel, or may be connected with each other in series and in parallel. Although FIG. 1 shows for conceptual purposes that the battery pack 100 includes only one battery 110, the battery pack 100 may include a plurality of batteries 110 that are connected with each other in series, in parallel, or in series and in parallel. The battery 110 may also include only one battery cell 111.

Each of the batteries 110 may include a plurality of battery modules, each including a plurality of battery cells 111. The battery pack 100 includes a pair of pack terminals 101 and 102 to which an electrical load or a charging device may be connected.

As an object that is subjected to estimation of a charging time of a battery according to embodiments of the present disclosure, the object may be the battery 110, or may be each of at least one battery cell 111 included in the battery 110. A method of estimating a charging time of one battery is described in more detail hereinafter, but the below description may also be applied to a method of estimating a charging time of each of a plurality of battery cells 111 included in the battery 110.

The battery pack 100 according to an embodiment of the present disclosure may include a switch. The switch may be connected between the battery 110 and one of the pack terminals 101 and 102 (for example, the pack terminal 101). The switch may be controlled by the processor 150. The battery pack 100 may further include a battery protection circuit, a fuse, a current sensor, and the like.

An apparatus for estimating a charging time of a battery, according to an embodiment of the present disclosure, includes the processor 150 and the memory 160.

The processor 150 controls overall operations of the apparatus for estimating a charging time of a battery. For example, the processor 150 may be implemented in a form that selectively includes a general purpose processor, an application-specific integrated circuit (ASIC), a chipset, a logic circuit, a register, a communication modem, and/or a data processing device, so as to perform the operations described herein.

The processor 150 may perform basic arithmetic, logic, and input/output operations, and may execute, for example, program code stored in the memory 160. The processor 150 may store data in the memory 160, or may load the data stored in the memory 160.

The memory 160 may be a recording medium that is readable by the processor 150, and may include a permanent mass storage device, such as random access memory (RAM), read only memory (ROM), and a disk drive. The memory 160 may store an operating system, and at least one program or application code. The memory 160 may store program code for estimating a charging time of a battery being charged, according to an embodiment of the present disclosure. The memory 160 may store data generated by measuring at least one parameter of the battery 110 being charged. For example, the data may include a charging/discharging current, terminal voltage, and/or temperature of the battery 110. The memory 160 may store program code for estimating a state-of-charge (SOC) of the battery 110 by using data generated by measuring at least one parameter of the battery 110, and SOC-open circuit voltage (OCV) data. At least one parameter of the battery 110 refers to a component or variable, such as a terminal voltage, charging/discharging current, and/or ambient temperature of the battery 110.

The apparatus for estimating a charging time of a battery may further include the voltage measurement unit 120 for measuring at least one parameter of the battery 110, the current measurement unit 130, and the temperature measurement unit 140. The apparatus for estimating of a charging time of a battery may further include a communication module (e.g., a communication interface) for communicating with other devices, such as an electronic control device of a vehicle, a controller of a charging device, and the like.

The voltage measurement unit 120 may be configured to measure a voltage of the battery 110. For example, as shown in FIG. 1, the voltage measurement unit 120 may be electrically connected to both ends of the battery 110 and/or the battery cell 111. Also, the voltage measurement unit 120 may be electrically connected to the processor 150 to transmit and receive electrical signals with the processor 150. The voltage measurement unit 120 may measure a voltage of the both ends of the battery 110 and/or the battery cell 111 at a time interval under control by the processor 150, and may output a signal indicating a magnitude of the measured voltage to the processor 150. The processor 150 may determine the voltage of the battery 110 and/or the battery cell 111 from the signal output from the voltage measurement unit 120. For example, the voltage measurement unit 120 may be implemented by using a voltage measurement circuit as would be known to those having ordinary skill in the art.

The current measurement unit 130 may be configured to measure a current of the battery 110. For example, as shown in FIG. 1, the current measurement unit 130 may include, or may be electrically connected to, a current sensor provided on a charge/discharge path of the battery 110 and/or the battery cell 111. Also, the current measurement unit 130 may be electrically connected to the processor 150 to transmit and receive an electrical signal with the processor 150. The current measurement unit 130 may repeatedly measure a magnitude of a charging current or discharging current of the battery 110 and/or the battery cell 111 at a time interval under control by the processor 150, and may output a signal indicating the magnitude of the measured current to the processor 150. The processor 150 may determine the magnitude of the current from the signal output from the current measurement unit 130. For example, the current sensor may be implemented by using a Hall sensor or a sense resistor as would be known to those having ordinary skill in the art.

The temperature measurement unit 140 may be configured to measure a temperature of the battery 110. For example, as shown in FIG. 1, the temperature measurement unit 140 may be connected to the battery 110 and/or the battery cell 111 to measure a temperature of a secondary battery provided in the battery 110 and/or the battery cell 111. Also, the temperature measurement unit 140 may be electrically connected to the processor 150 to transmit and receive an electrical signal with the processor 150. The temperature measurement unit 140 may repeatedly measure a temperature of the secondary battery at a time interval, and may output a signal indicating a magnitude of the measured temperature to the processor 150. The processor 150 may determine the temperature of the secondary battery from the signal output from the temperature measurement unit 140. For example, the temperature measurement unit 140 may be implemented by using a thermocouple as would be known to those having ordinary skill in the art.

The processor 150 may estimate an SOC of the battery 110 by using at least one of a voltage measurement value, a current measurement value, and a temperature measurement value of the battery 110, which are received from the voltage measurement unit 120, the current measurement unit 130, and the temperature measurement unit 140, respectively. Here, the SOC of the battery 110 may be calculated as a value corresponding to a remaining amount of charge of the battery 110 in the range of 0% to 100%.

According to an embodiment of the present disclosure, the processor 150 may estimate an SOC of the battery 110 by integrating a charging current and a discharging current of the battery 110. Here, when charging or discharging of the battery 110 starts, an initial value of the SOC of the battery 110 may be determined by using an OCV of the battery 110, which is measured before the charging or discharging of the battery 110 starts. In this case, the processor 150 may include an SOC-OCV lookup table in which an SOC is defined for each OCV, and may map an SOC corresponding to an OCV of the battery 110 from the lookup table.

According to another embodiment of the present disclosure, the processor 150 may estimate an SOC of the battery 110 by using an extended Kalman filter. The extended Kalman filter refers to a mathematical algorithm for adaptively estimating an SOC of a secondary battery by using a voltage, a current, and a temperature of the secondary battery.

The SOC of the battery 110 may also be determined by other suitable methods known by those having ordinary skill in the art by which the SOC may be estimated by selectively utilizing a voltage, a current, and a temperature of a secondary battery, other than the current integration method or extended Kalman filter described above.

Referring to FIGS. 1 and 2, the processor 150 according to an embodiment of the present disclosure may estimate an SOC of the battery 110 by using at least one parameter of the battery 110 as described above, and may estimate an internal resistance of the battery 110 by using the at least one parameter of the battery 110, the SOC of the battery 110, and SOC-OCV data. The estimation of the internal resistance of the battery 110 will be described in more detail below.

The processor 150 may estimate a time length of a constant current charging section CC by using the SOC, the internal resistance, and the at least one parameter of the battery 110, and may estimate a time length of a constant voltage charging section CV by using the SOC, the internal resistance, and the at least one parameter of the battery 110. In an embodiment, the CC section is a section in which a charging current of the battery 110 is constantly supplied as a constant current. As shown in FIG. 2, in the constant current charging section CC, a terminal voltage (e.g., battery voltage) of the battery 110 increases from an initial voltage Vi, at which the charging starts, to a charging voltage Vref, and flows at a charging current of a constant current Icc. At this time, a time length from 0 to t1 is a time length of the constant current charging section CC. The constant voltage charging section CV is a section in which a charging voltage of the battery 110 is constantly maintained as a constant voltage. As shown in FIG. 2, in the constant voltage charging section CV section, the terminal voltage of the battery 110 is maintained as a constant voltage Vref, and the charging current decreases. At this time, a time length from t1 to t2 is a time length of the constant voltage charging section CV. The SOC of the battery 110 increases from 0% to 100% through the constant current charging section CC and the constant voltage charging section CV.

Figure 3:
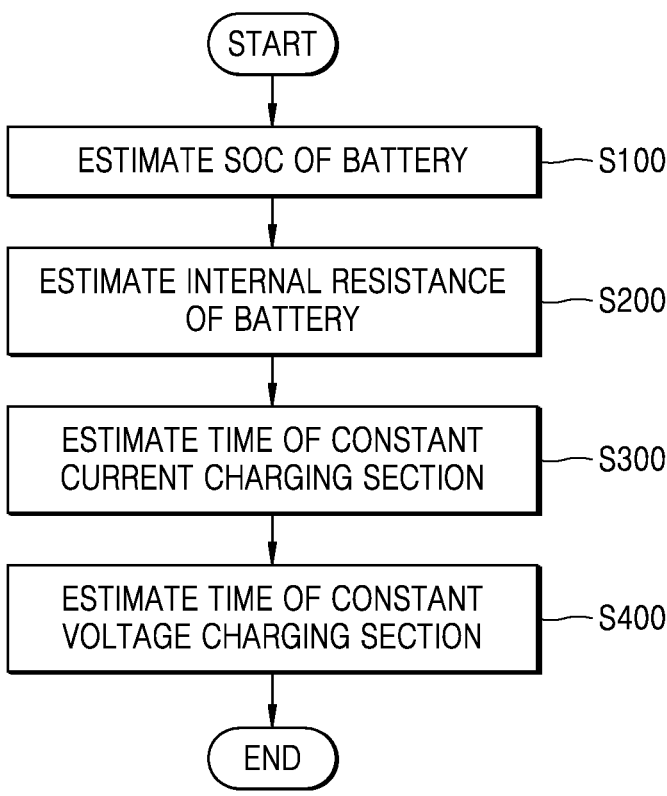
FIG. 3 is a flowchart of a method of estimating a charging time of a battery, according to an embodiment of the present disclosure.
Figure 4:
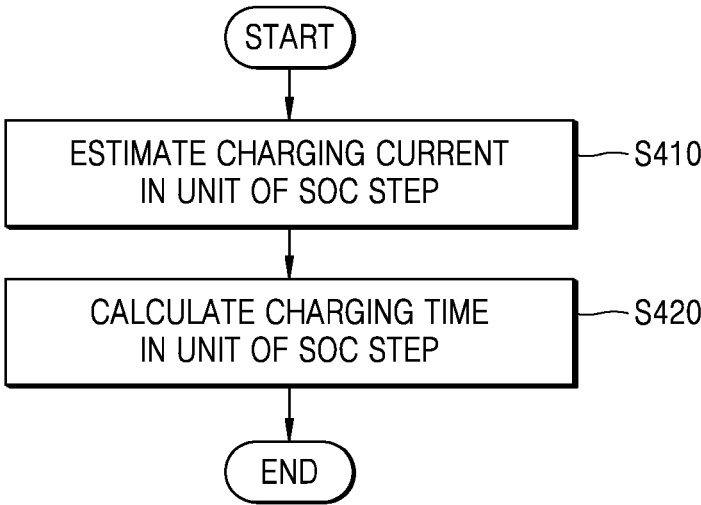
FIG. 4 is a flowchart illustrating various processes of the method of estimating a charging time of a battery shown in FIG. 3, according to an embodiment of the present disclosure.
Figure 5:
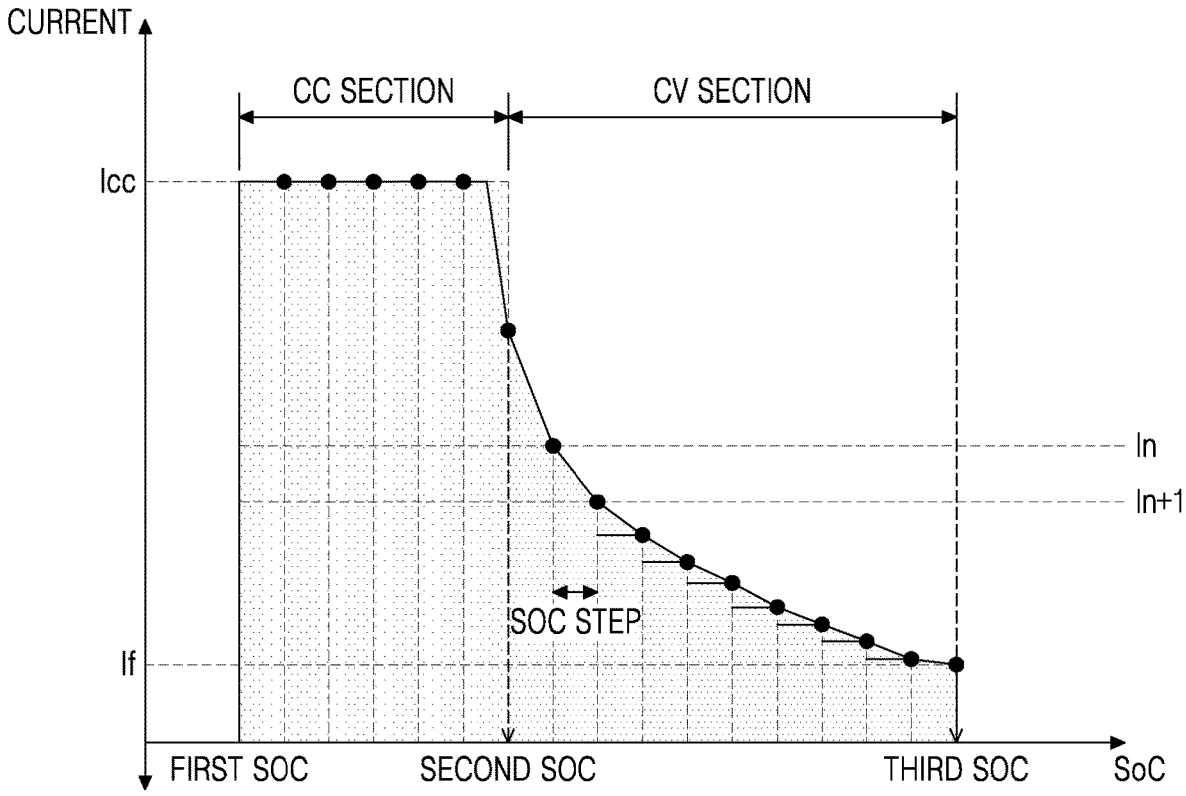
FIG. 5 is a diagram illustrating a method of estimating a charging time of a battery, according to an embodiment of the present disclosure.

FIG. 3 is a flowchart of a method of estimating a charging time of a battery, according to an embodiment of the present disclosure. FIG. 4 is a flowchart illustrating various processes of the method of estimating a charging time of a battery shown in FIG. 3, according to an embodiment of the present disclosure. FIG. 5 is a diagram illustrating a method of estimating a charging time of a battery, according to an embodiment of the present disclosure.

A method of estimating a charging time of a battery, according to an embodiment of the disclosure, may be performed by the processor 150 shown in FIG. 1.

First, referring to FIGS. 3 and 5, a method of estimating a charging time of a battery being charged, according to an embodiment of the present disclosure, includes estimating an SOC of the battery (operation S100), estimating an internal resistance of the battery (operation S200), estimating a time length of a constant current charging section (operation S300), and estimating a time length of a constant voltage charging section (operation S400). The SOC of the battery may be estimated (e.g., at operation S100) by measuring at least one parameter of the battery. The internal resistance of the battery may be estimated (e.g., at operation S200) by using the at least one parameter of the battery, the SOC of the battery, and SOC-OCV data. The time length of the constant current charging section may be estimated (e.g., at operation S300) by using the SOC, the internal resistance, and the at least one parameter of the battery. The time length of the constant voltage charging section may be estimated (e.g., at operation S400) by using the SOC, the internal resistance, and the at least one parameter of the battery.

As shown in FIG. 4, the estimating of the time length of the constant voltage charging section (e.g., at operation S400) may include estimating a charging current of the battery in a unit of an SOC step (e.g., a predetermined SOC step) (operation S410), and calculating the time length of the constant voltage charging section in the unit of the SOC step (operation S420). The charging current of the battery may be estimated in the unit of the SOC step (e.g., at operation S410) by using the SOC, the internal resistance, and the at least one parameter of the battery, and the time length of the constant voltage charging section may be calculated in the unit of the SOC step (e.g., at operation S420) by using the SOC, the at least one parameter, and the charging current of the battery.

In an embodiment, the at least one parameter of the battery may include a voltage, a current, and a temperature of the battery.

As shown in FIG. 5, in the constant current charging section CC and the constant voltage charging section CV of the battery being charged, the SOC of the battery may increase from a first SOC to a third SOC. In more detail, the SOC at a time point when the charging of the battery starts may be expressed as a first SOC, the SOC at a time point when the constant voltage charging section CV of the battery starts may be expressed as a second SOC, and the SOC at a time point when the charging of the battery is completed may be expressed as a third SOC.

The charging current of the battery may decrease from a constant current Icc in the constant current charging section CC to a charging end current If at a time point when the charging ends.

The charging current of the battery according to an embodiment of the disclosure may be estimated in the unit of the SOC step (e.g., the predetermined SOC step) by using the SOC, the internal resistance, and the at least one parameter of the battery.

The SOC step represents a reference value dividing the constant current charging section CC and the constant voltage charging section CV, by a predetermined SOC unit, between a start SOC (e.g., the first SOC) of the battery at a time point at which the charging of the battery starts and an end SOC (e.g., the third SOC) at a time point at which the charging is completed. As shown in FIG. 5, the SOC step may be a reference value dividing the constant current charging section CC and the constant voltage charging section CV between the first SOC and the third SOC by a predetermined SOC unit. For example, the SOC step may be a unit having a value of 6%. When the SOC step is 6% and the SOC of the battery is charged from 10% to 100%, the first SOC of 10% to the third SOC of 100% may be divided into a total of 15 SOC steps (e.g., (100–10)/6).

In an embodiment, a value of the charging current of the battery may be calculated by dividing a difference between the terminal voltage of the battery and the OCV of the battery by the internal resistance of the battery, for example, as shown in Equation 1.

$$In = \frac{V - OCV}{ir}$$ Equation 1

In Equation 1, In refers to the charging current of the battery, V refers to the terminal voltage of the battery, OCV refers to the open circuit voltage of the battery, and it refers to the internal resistance of the battery.

As shown in FIG. 5, the charging current of the battery may be estimated in the order of In and In+1, based on the SOC step as a unit. For example, when the constant voltage charging section CV is divided into 11 SOC step units, 11 currents may be estimated as the charging current of the battery in the constant voltage charging section CV.

The charging time of the battery may be calculated as the sum of the time length of the constant current charging section CC and the time length of the constant voltage charging section CV, for example, as shown in Equation 2.

$$Tt = Tcc + Tcv$$ Equation 2

In Equation 2, Tt refers to the charging time of the battery, Tcc refers to the time length of the constant current charging section, and Tcv refers to the time length of the constant voltage charging section.

The time length of the constant current charging section CC may be calculated as a value obtained by dividing a ratio of the SOC of the battery charged in the CC section to a maximum capacity of the battery by the charging current, for example, as shown in Equation 3.

$$Tcc = \frac{Second\ SOC - First\ SOC}{100} \times \frac{Max}{Icc} \times 3600$$ Equation 3

In Equation 3, Tcc refers to the time length of the constant current charging section, the first SOC refers to the SOC at a time point when the charging starts, the second SOC refers to the SOC at a time point when the constant voltage charging section starts, Max refers to the maximum capacity of the battery, and Icc refers to the charging current of the constant current charging section.

The time length of the constant voltage charging section CV section may be calculated as the sum of the time length of the charging section of each SOC step unit by using a plurality of charging currents estimated in the SOC step unit, for example, as shown in Equation 4.

$$Tcv = Tcv_n + Tcv_{n+1}$$ Equation 4

In Equation 4, Tcv refers to the time length of the constant voltage charging section, $Tcv_n$ refers to the time length of an $n^{th}$ SOC step section by using the charging current estimated in an $n^{th}$ SOC step, where n is a natural number, and $Tcv_{n+1}$ refers to the time length of an n+1th SOC step section by using the charging current estimated in an $n+1^{th}$ SOC step.

The time length of the nth SOC step section may be calculated as a value obtained by dividing a ratio of the SOC of the battery charged in the SOC step section to the maximum capacity of the battery by the charging current, for example, as shown in Equation 5.

$$Tcv_n = \frac{SOC\ step}{100} \times \frac{Max}{In} \times 3600$$ Equation 5

In Equation 5, $Tcv_n$ refers to the time length of the $n^{th}$ SOC step section by using the charging current estimated in the $n^{th}$ SOC step, SOC step refers to the predetermined SOC unit, Max refers to the maximum capacity of the battery, and In refers to the $n^{th}$ estimated charging current.

According to one or more embodiments of the present disclosure, a charging time of a battery may be accurately estimated by estimating a charging current that decreases in a constant voltage charging section, and using the estimated charging current. According to one or more embodiments of the present disclosure, a charging time of a battery may be more effectively estimated by estimating a charging current in a unit of an SOC step, and calculating the charging time in the unit of the SOC step.

Figure 6:
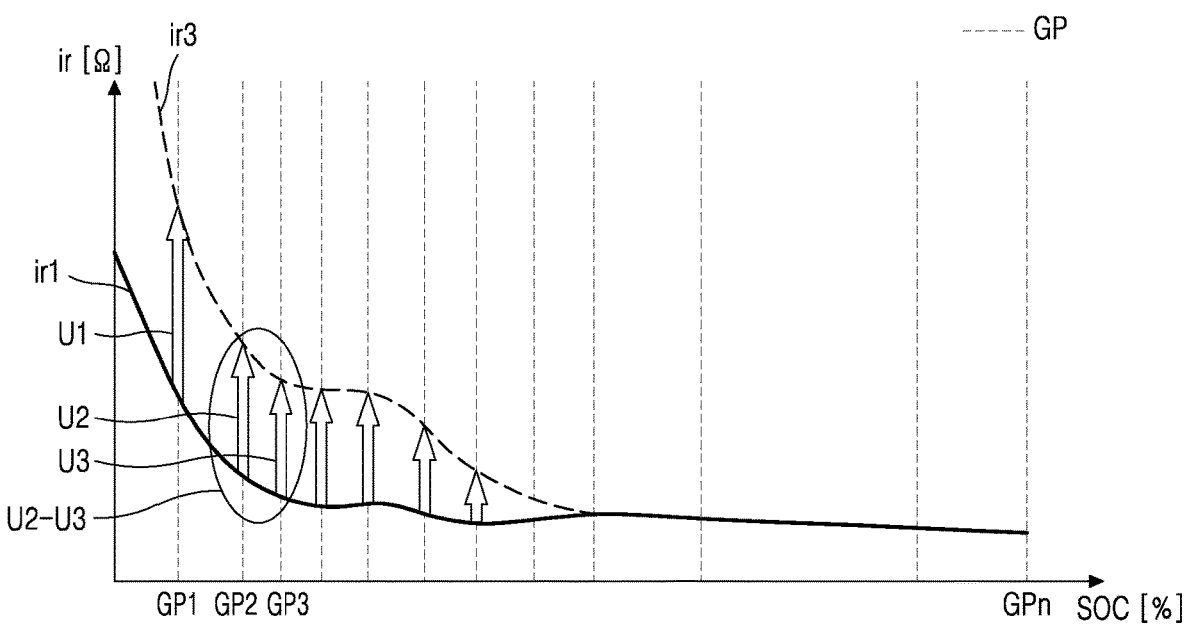
FIGS. 6-7 are diagrams illustrating an example of a process of estimating an internal resistance of a battery, according to an embodiment of the present disclosure.
Figure 7:
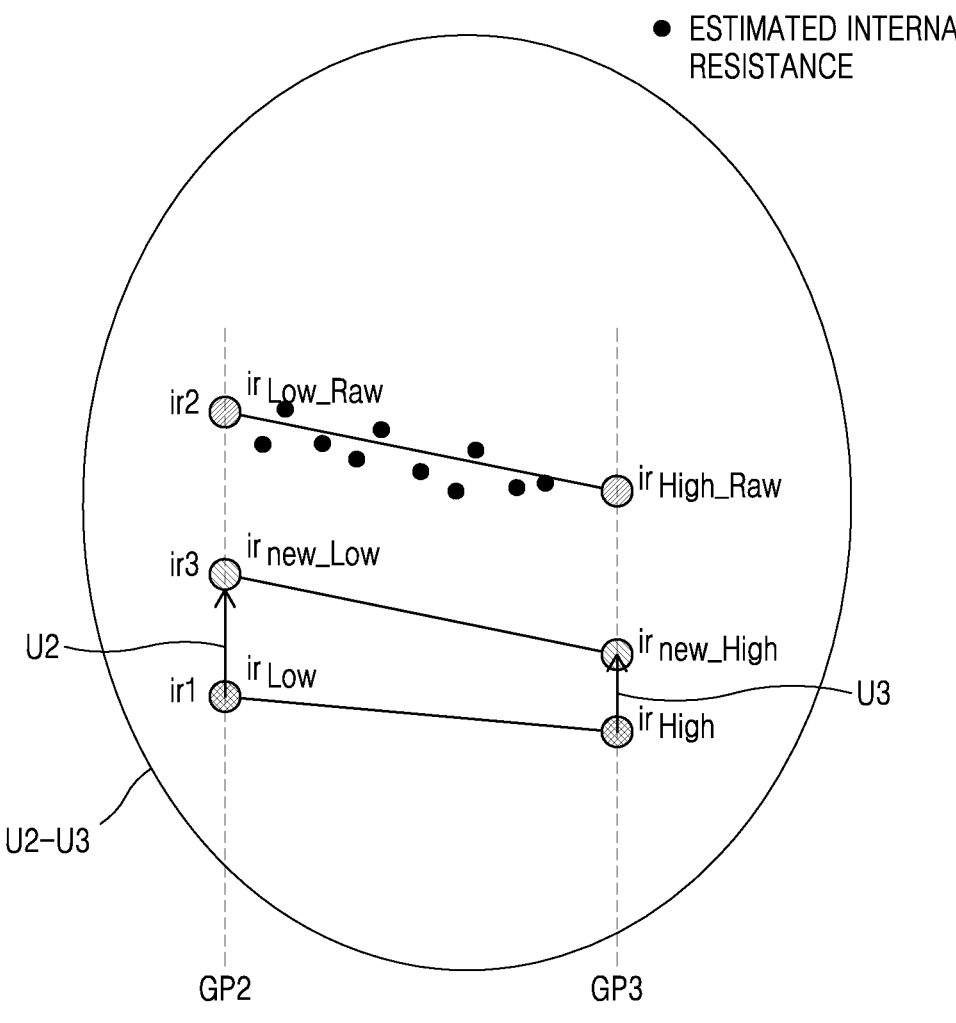

FIGS. 6 and 7 are diagrams illustrating an example of a process of estimating an internal resistance of a battery, according to an embodiment of the disclosure.

A process of estimating an internal resistance of a battery, according to an embodiment of the disclosure, may be performed by the processor 150 shown in FIG. 1.

First, the internal resistance of the battery may be estimated by using at least one parameter of the battery, an SOC of the battery, and SOC-OCV data.

In an embodiment, the internal resistance of the battery may include a first internal resistance ir1, an estimated internal resistance, a second internal resistance ir2, and a third internal resistance ir3.

As shown in FIG. 6, the first internal resistance ir1 may be calculated with respect to the SOC of the battery by using pre-stored SOC-internal resistance data of the battery.

The estimated internal resistance may be estimated by calculating an OCV of the battery by using the SOC-OCV data, based on the SOC of the battery, and by using a difference between the OCV and a voltage of the battery.

The second internal resistance ir2 may be estimated with respect to a plurality of SOC grid points GP, based on a linear regression equation, by using the estimated internal resistance and the SOC of the battery. For example, the linear regression equation may be derived based on the estimated internal resistance as a Y value and the SOC as an X value.

The third internal resistance ir3 may be calculated with respect to the plurality of SOC grid points GP by using the first internal resistance ir1 and the second internal resistance ir2.

As shown in FIG. 7, the processor 150 may calculate an OCV with respect to a current SOC by using the SOC-OCV data, and may estimate an estimated internal resistance by using a difference between the OCV and a current terminal voltage of the battery, for example, as shown in Equation 6.

$$ir = \frac{OCV - V}{I}$$ Equation 6

In Equation 6, it refers to the estimated internal resistance of the battery, OCV refers to the open circuit voltage of the battery, V refers to the terminal voltage of the battery, and I refers to the charging current.

In an embodiment, as shown in FIG. 7, the processor 150 may estimate the second internal resistance ir2 of the battery with respect to a second SOC grid point GP2 and a third SOC grid point GP3 by using the estimated internal resistance and the SOC of the battery. In more detail, the processor may derive a linear regression equation based on the estimated internal resistance as a Y value and the SOC of the battery as an X value with respect to the estimated internal resistance and the SOC of the battery, and may estimate the second internal resistance ir2 of the battery with respect to the second and third SOC grid points GP2 and GP3, based on the linear regression equation.

As shown in FIG. 6, the SOC grid points GP indicate, based on the SOC of the battery on the horizontal axis and the internal resistance of the battery on the vertical axis, points for estimating the internal resistance of the battery with respect to a predetermined SOC of the horizontal axis. For example, the SOC grid points GP are measurement points that are optimized by experimental values, and the internal resistance may be estimated based on 15 SOC grid points GP during discharge and 8 SOC grid points GP during charging.

Estimating internal resistance of a battery by using the SOC-OCV data for all SOCs may be inefficient and the resulting value may be inaccurate, and thus, according to one or more embodiments of the present disclosure, the internal resistance may be efficiently and accurately estimated by using the SOC grid points.

As shown in FIG. 6, in an embodiment of the present disclosure, the first internal resistance ir1 may be calculated based on a first SOC grid point GP1, the second SOC grid point GP2, and the third SOC grid point GP3. Also, the first internal resistance ir1 may be updated to the third internal resistance ir3 by internal resistance updates U1, U2, and U3.

Referring to FIG. 7 for an internal resistance update U2-U3, for the second SOC grid point GP2 and the third SOC grid point GP3, the estimated internal resistance of the battery is estimated by calculating an OCV of the battery by using the SOC-OCV data, based on the SOC of the battery, and by using a difference between the OCV and a voltage of the battery.

A linear regression equation based on the estimated internal resistance as a Y value and the SOC as an X value with respect to the estimated internal resistance and the SOC is derived, and based on the linear regression equation, the second internal resistance ir2 of the battery is estimated with respect to the second SOC grid point GP2 and the third SOC grid point GP3.

An internal resistance update value is calculated by multiplying a difference between the first internal resistance ir1 and the second internal resistance ir2 by a predetermined coefficient, and the third internal resistance ir3 is calculated by adding the first internal resistance ir1 and the internal resistance update value, for example, as shown in Equation 7.

$$ir3=ir1+0.1\times(ir2-ir1)\qquad\text{Equation 7}$$

In Equation 7, ir3 refers to the third internal resistance, ir1 refers to the first internal resistance, ir2 refers to the second internal resistance, and 0.1 is the predetermined coefficient.

The first internal resistance ir1 is updated to the third internal resistance ir3 by using the resulting values of the internal resistance updates U2 and U3.

According to one or more embodiments of the present disclosure, a charging current of a battery may be more accurately estimated by more accurately estimating an internal resistance value of the battery by performing the internal resistance update, and a charging time of the battery may be more accurately estimated by more accurately estimating the charging current of the battery.

It should be appreciated that the various embodiments described herein are provided as examples, and are not necessarily distinguished from each other and/or independently implemented from each other. Accordingly, it should be appreciated by those having ordinary skill in the art that the embodiments described herein may be implemented in any suitable combinations with each other.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Therefore, the various embodiments described herein may be implemented in a form of a computer program executable by various components on a computer, and such a computer program may be recorded in a computer-readable medium. Here, the medium may continuously store computer-executable programs, or temporarily store the computer-executable programs for execution or downloading. Also, the medium may be any one of various recording media or storage media in which a single piece or plurality of pieces of hardware are combined, and the medium is not limited to a medium directly connected to a computer system, but may be distributed on a network. Examples of the medium include a magnetic medium, such as a hard disk, a floppy disk, and a magnetic tape, an optical recording medium, such as a CD-ROM and a DVD, a magneto-optical medium, such as a floptical disk, and ROM, RAM, and a flash memory, which are configured to store program instructions. Other examples of the medium include a recording medium and a storage medium managed by application stores distributing applications or by websites, servers, and the like supplying or distributing other various types of software.

As used herein, the term "unit" or "module" may refer to a hardware component, such as a processor or circuit, and/or a software component that is executed by a hardware component, such as a processor. For example, the "unit" or "module" may be implemented by various suitable components, such as software components, object-oriented software components, class components, and task components, processes, functions, attributes, procedures, subroutines, segments of program code, drivers, firmware, micro code, circuits, data, a database, data structures, tables, arrays, variables, and/or the like.

According to one or more embodiments of the present disclosure, a charging time of a battery may be accurately estimated by dividing a constant current charging section and a constant voltage charging section, and estimating a charging current at the constant voltage charging section. According to one or more embodiments of the present disclosure, a charging current and a charging time of a battery may be accurately estimated by estimating an internal resistance of the battery. However, the present disclosure is not limited to the above aspects and features.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A method of estimating a charging time of a battery, the method comprising:

estimating a state-of-charge (SOC) of the battery by measuring at least one parameter of the battery;

estimating an internal resistance of the battery based on the at least one parameter of the battery, the SOC of the battery, and SOC-open circuit voltage (OCV) data;

estimating a time length of a constant current charging section based on the SOC, the internal resistance, and the at least one parameter of the battery; and estimating a time length of a constant voltage charging section based on the SOC, the internal resistance, and the at least one parameter of the battery, wherein the estimating of the time length of the constant voltage charging section comprises:

estimating a charging current of the battery in a unit of an SOC step based on the SOC, the internal resistance, and the at least one parameter of the battery; and calculating the time length of the constant voltage charging section in the unit of the SOC step based on the SOC, the at least one parameter, and the charging current of the battery, and wherein the estimating of the internal resistance of the battery comprises:

calculating a first internal resistance of the battery with respect to the SOC of the battery based on SOC-internal resistance data of the battery;

estimating a second internal resistance of the battery by calculating an OCV of the battery by using the SOC-OCV data, based on the SOC of the battery, and a difference between the OCV and a voltage of the battery; and calculating a third internal resistance of the battery with respect to a plurality of SOC grid points based on the first internal resistance and the second internal resistance.

2. The method of claim 1, wherein the at least one parameter comprises a voltage, a current, and a temperature of the battery.

3. The method of claim 1, wherein the estimating of the second internal resistance comprises:

calculating the OCV of the battery by using the SOC-OCV data, based on the SOC of the battery;

estimating an estimated internal resistance of the battery based on a difference between the OCV and the voltage of the battery;

deriving a linear regression equation based on the estimated internal resistance as a Y value and the SOC as an X value with respect to the estimated internal resistance and the SOC of the battery; and calculating the second internal resistance of the battery with respect to the plurality of SOC grid points, based on the linear regression equation.

4. The method of claim 1, wherein the plurality of SOC grid points indicate, based on the SOC of the battery on a horizontal axis and the internal resistance of the battery on a vertical axis, points for estimating the internal resistance of the battery with respect to an SOC of the horizontal axis.

5. The method of claim 1, wherein the calculating of the third internal resistance comprises:

calculating an internal resistance update value by multiplying a difference between the first internal resistance and the second internal resistance by a coefficient; and calculating the third internal resistance by adding the first internal resistance and the internal resistance update value.

6. The method of claim 1, wherein the SOC step represents a reference value dividing the constant current charging section and the constant voltage charging section, by an SOC unit, between a start SOC of the battery at a time point at which charging of the battery starts and an end SOC at a time point at which the charging is completed.

7. Non-transitory computer readable media containing program instructions that, when executed by a computing device, cause the computing device to perform the method of claim 1.

8. An apparatus for estimating a charging time of a battery, the apparatus comprising:

memory storing data generated by measuring at least one parameter of the battery being charged; and at least one processor configured to:

estimate a state-of-charge (SOC) of the battery based on at least one parameter of the battery;

estimate an internal resistance of the battery based on the at least one parameter of the battery, the SOC of the battery, and SOC-open circuit voltage (OCV) data;

estimate a time length of a constant current charging section based on the SOC, the internal resistance, and the at least one parameter of the battery;

estimate a time length of a constant voltage charging section based on the SOC, the internal resistance, and the at least one parameter of the battery;

estimate a charging current of the battery in a unit of an SOC step based on the SOC, the internal resistance, and the at least one parameter of the battery; and calculate the time length of the constant voltage charging section in the unit of the SOC step based on the SOC, the at least one parameter, and the charging current of the battery, wherein:

the internal resistance of the battery comprises a first internal resistance, an estimated internal resistance, a second internal resistance, and a third internal resistance;

the first internal resistance is calculated with respect to the SOC of the battery based on SOC-internal resistance data of the battery;

the estimated internal resistance is estimated by calculating an OCV of the battery based on the SOC-OCV data, the SOC of the battery, and a difference between the OCV and a voltage of the battery;

the second internal resistance is estimated with respect to a plurality of SOC grid points, based on a linear regression equation, the estimated internal resistance, and the SOC; and the third internal resistance is calculated with respect to the plurality of SOC grid points based on the first internal resistance and the second internal resistance.

9. The apparatus of claim 8, wherein the at least one parameter comprises a voltage, a current, and a temperature of the battery.

10. The apparatus of claim 8, wherein the linear regression equation is derived based on the estimated internal resistance as a Y value and the SOC as an X value.

11. The apparatus of claim 8, wherein the plurality of SOC grid points indicate, based on the SOC of the battery on a horizontal axis and the internal resistance of the battery on a vertical axis, points for estimating the internal resistance of the battery with respect to an SOC of the horizontal axis.

12. The apparatus of claim 8, wherein the third internal resistance is calculated by adding the first internal resistance and an internal resistance update value, and the internal resistance update value is calculated by multiplying a difference between the first internal resistance and the second internal resistance by a coefficient.

13. The apparatus of claim 8, wherein the SOC step represents a reference value dividing the constant current charging section and the constant voltage charging section, by an SOC unit, between a start SOC of the battery at a time point at which charging of the battery starts and an end SOC at a time point at which the charging is completed.

* * * * *